(12) United States Patent
Lin et al.

(10) Patent No.: US 9,780,213 B2
(45) Date of Patent: Oct. 3, 2017

(54) SEMICONDUCTOR DEVICE HAVING A REVERSED T-SHAPED PROFILE IN THE METAL GATE LINE-END

(71) Applicant: Taiwan Semiconductor Manufacturing Company Limited, Hsinchu (TW)

(72) Inventors: Chien-Chih Lin, Hsinchu (TW); Chien-Hung Yeh, Hsinchu (TW); Guan-Jie Shen, Hsinchu (TW); Chia-Der Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 6 days.

(21) Appl. No.: 14/253,156

(22) Filed: Apr. 15, 2014

(65) Prior Publication Data

US 2015/0294874 A1 Oct. 15, 2015

(51) Int. Cl.
*H01L 29/78* (2006.01)
*H01L 21/28* (2006.01)
(Continued)

(52) U.S. Cl.
CPC ...... *H01L 29/785* (2013.01); *H01L 21/28114* (2013.01); *H01L 27/0886* (2013.01);
(Continued)

(58) Field of Classification Search
CPC ............ H01L 21/28114; H01L 29/78; H01L 29/66545; H01L 29/42356;
(Continued)

(56) References Cited

U.S. PATENT DOCUMENTS 8,264,048 B2 * 9/2012 Rachmady ........ H01L 21/28114
257/213
2005/0121703 A1 * 6/2005 Hieda ............... H01L 29/78648
257/288
(Continued)

FOREIGN PATENT DOCUMENTS

CN 1577850 A 2/2005

OTHER PUBLICATIONS

Office Action; Korean Application No. 10-2015-0053385; Dated Oct. 12, 2016.
(Continued)

*Primary Examiner* — Shouxiang Hu
(74) *Attorney, Agent, or Firm* — McDermott Will & Emery LLP

(57) ABSTRACT

A method of fabricating a metal gate structure in a semiconductor device is disclosed. The method comprises removing a dummy poly gate, removing IL oxide and STI using a dry etch process and a wet lateral etch process to form a T-shape void in the semiconductor device, and depositing metal gate material in the T-shape void to form a T-shape structure in a metal gate line-end. A semiconductor device fabricated from a process that included the removal of a dummy poly gate is disclosed. The semiconductor device comprises an OD fin and a metal gate fabricated above a section of the OD fin and adjacent to a side section of the OD fin. The metal gate has a T-shape structure in a metal gate line-end. The T-shape structure was formed by removing IL oxide and STI using a dry and a wet lateral etch process to form a T-shape void.

20 Claims, 5 Drawing Sheets

(51) Int. Cl.
  *H01L 29/66* (2006.01)
  *H01L 27/088* (2006.01)
  *H01L 29/423* (2006.01)

(52) U.S. Cl.
  CPC .. *H01L 29/42356* (2013.01); *H01L 29/42376* (2013.01); *H01L 29/66545* (2013.01); *H01L 29/66795* (2013.01); *H01L 29/78* (2013.01)

(58) Field of Classification Search
  CPC ......... H01L 21/32133; H01L 21/31111; H01L 21/31116; H01L 29/42376; H01L 29/66795; H01L 29/785; H01L 29/42392; H01L 29/6681; H01L 21/823431; H01L 21/845; H01L 27/0886; H01L 27/10879; H01L 27/1211; H01L 27/10826
  USPC .......................................... 257/347, 401, 412
  See application file for complete search history.

(56) References Cited

U.S. PATENT DOCUMENTS

| | | | |
|---|---|---|---|
| 2005/0224880 A1* | 10/2005 | Lee | H01L 29/42392 257/347 |
| 2006/0172497 A1 | 8/2006 | Hareland et al. | |
| 2010/0311213 A1* | 12/2010 | Orlowski | H01L 29/66795 438/164 |
| 2012/0256259 A1* | 10/2012 | Surthi | H01L 27/10826 257/334 |
| 2013/0302976 A1* | 11/2013 | Tsai | H01L 21/283 438/589 |

OTHER PUBLICATIONS

Office Action dated Aug. 2, 2017 issued in Chinese Patent Application No. 200410050127.0.

* cited by examiner

SEMICONDUCTOR DEVICE HAVING A REVERSED T-SHAPED PROFILE IN THE METAL GATE LINE-END

BACKGROUND

The technology described in this patent document relates to metal-oxide semiconductor field-effect transistor (MOSFET) devices, and more specifically to MOSFET devices having a gate structure formed using a replacement gate process, as well as to methods to fabricate such devices.

Scaling of semiconductor devices, such as a MOSFET, has enabled continued improvement in speed, performance, density, and cost per unit function of integrated circuits over the past few decades. Improvements to the process for creating a metal gate can further the scaling of integrated circuits.

A MOSFET can be fabricated on a bulk semiconductor substrate (planar devices) or on a silicon-on-insulator (SOI) type of structure. In a replacement gate process a dummy gate structure can be formed from, for example, polysilicon (poly). After source-drain (S/D) processing is initiated or continued, the dummy gate structure is removed and replaced by an electrically conductive metal-containing gate stack that overlies a channel region between the S/D in the bulk semiconductor substrate or in the silicon layer of the SOI structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
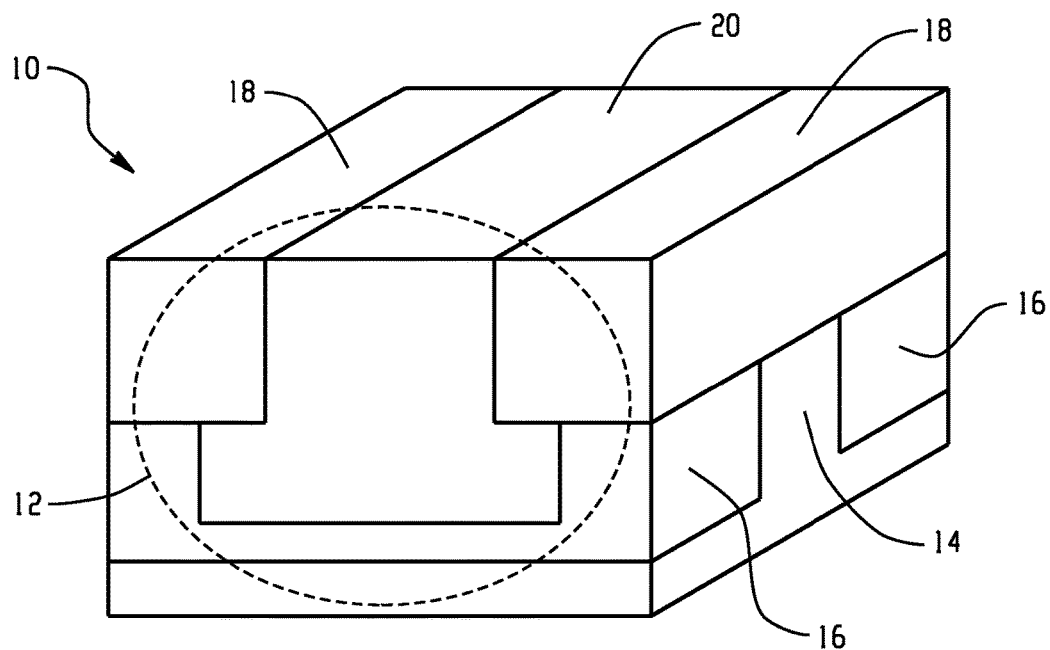
FIG. 1 is a cross-sectional view depicting an example semiconductor structure 10 having a T-shaped structure 12 in the metal gate line-end, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Planar transistors can be fabricated using a process involving fabricating an oxidation diffusion (OD) region for the transistor, fabricating a dummy poly gate for the transistor, fabricating the transistor's source and drain regions, and then fabricating the transistor's gate region using what can be termed as a replace poly gate (RPG) process. A RPG process involves removing the dummy poly gate and replacing the dummy poly gate with a metal gate. In a semiconductor fabrication process that utilizes a RPG process, transistor performance can be improved by forming a line end section of the metal gate into a T-shaped structure. This can allow the transistor to utilize a larger effective OD width with better gate controllability. This can result in improved transistor performance.

FIG. 1 depicts an example semiconductor structure 10 having a T-shaped structure 12 in the metal gate line-end. The example semiconductor structure includes an OD region 14 with a raised fin, shallow trench isolation (STI) 16 material above portions of the OD region and surrounding the OD fin, and an interlayer dielectric (ILD) layer 18 above the STI 16 and OD fin 14. The example semiconductor structure further includes a metal gate 20 that includes a T-shaped structure 12 in the metal gate line-end.

Figure 2:
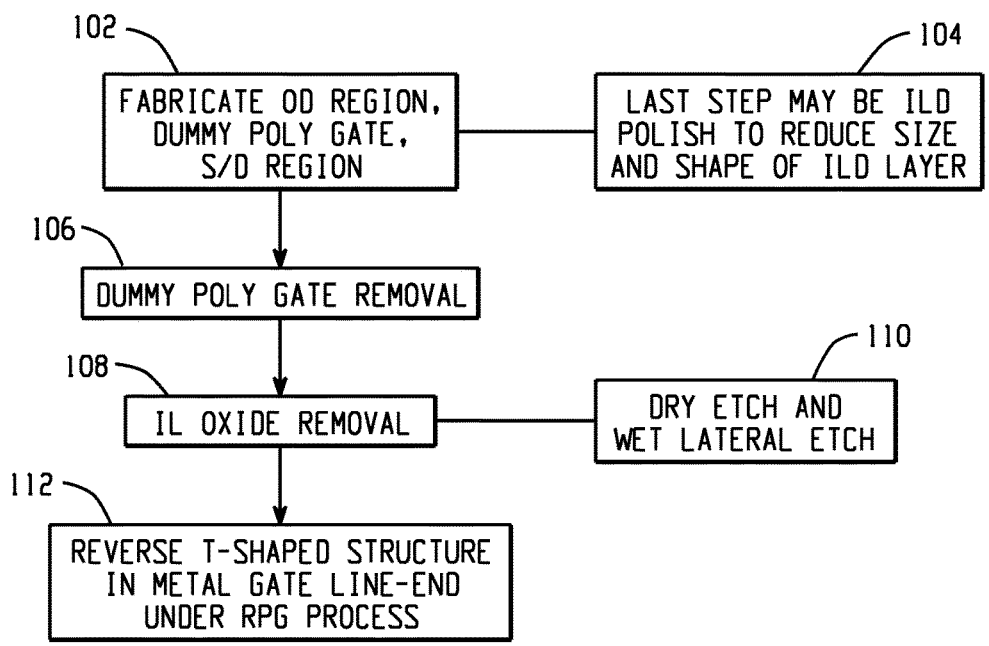
FIG. 2 is a process flow chart depicting an example process for fabricating a semiconductor structure having a T-shaped structure in the metal gate end, in accordance with some embodiments.

FIG. 2 is a process flow chart depicting an example process for fabricating a semiconductor structure having a T-shaped structure in the metal gate end. A semiconductor structure having an OD region with an OD fin, a dummy poly gate, a STI layer surrounding the OD fin, and a layer of ILD material above the OD fin and STI layer are fabricated first (operation 102). A final step of the fabrication operations may be to reduce the size and shape the poly gate and ILD layer using ILD polish operations (operation 104) such as chemical mechanical polishing (CMP) operations.

Next, dummy poly gate removal operations are performed (operation 106) to remove the dummy poly gate material. Dummy poly gate removal may be performed by operations such as etching and may result in the removal of the dummy poly gate material but leaving dummy interlayer (IL) oxide above the top surface of the OD fin.

After dummy poly gate removal operations are performed, dummy IL oxide removal operations (operation 108) take place. Dummy IL oxide removal operations in this example involve dry and wet etch operations (operation 110). The dry and wet etch operations may be performed to remove the dummy IL oxide residing above the top face of the OD fin, to remove STI under the area vacated by the dummy poly gate, and to remove STI under a portion of the ILD layer (e.g., with a lateral etch of 1 to 10 nm) and adjacent to a side face of the OD fin to form a reversed T-shaped void in the semiconductor structure. In some examples, the wet etch operations follow the dry etch operations.

After dummy IL oxide removal, metal gate material and Hi-K dielectric material can be deposited (operation 112) in the area vacated by the dummy poly gate removal and IL oxide removal operations. The metal gate material can be deposited and polished to form a substantially reversed T-shaped structure in the metal gate line-end.

Figure 3:
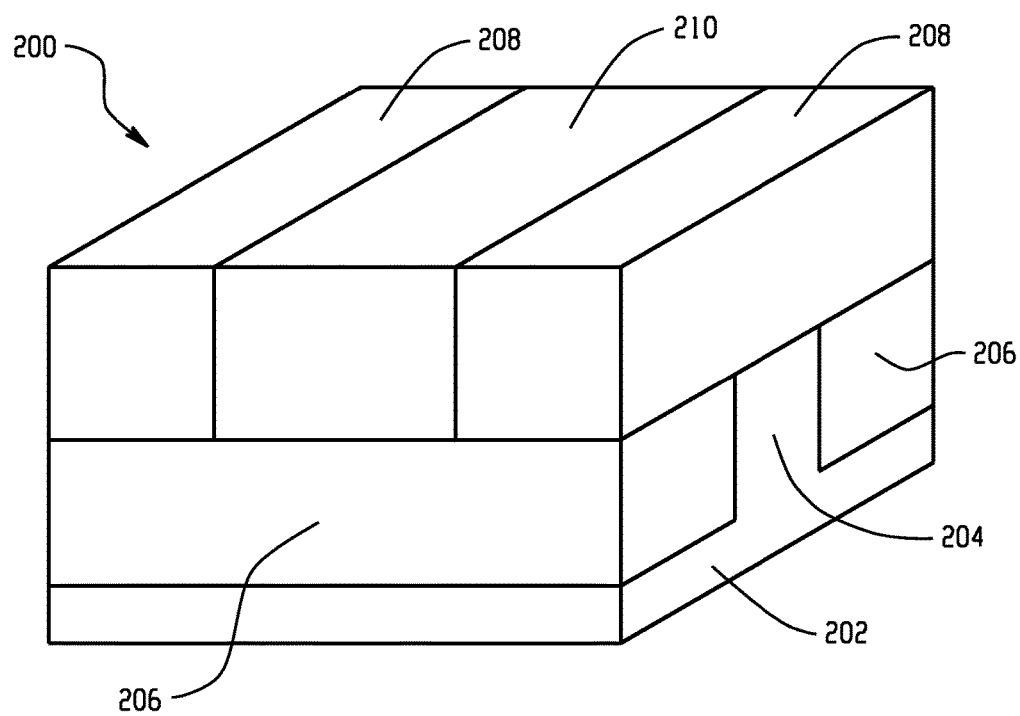
FIGS. 3-6, depict cross-sectional views of an example semiconductor during different stages of fabrication of a transistor with a metal gate having a T-shaped structure in the metal gate line-end, in accordance with some embodiments.

FIGS. 3-6, depict cross-sectional views of an example semiconductor during different stages of fabrication of a transistor with a metal gate having a substantially reversed T-shaped structure in the metal gate line-end. Depicted in FIG. 3 is an example semiconductor device fabricated with an OD region 202 with an embedded channel portion 204 in a shallow trench isolation (STI) structure 206, and an ILD layer 208 above the STI 206 and OD fin 204. The example semiconductor structure further includes a dummy poly gate 210.

Figure 4:
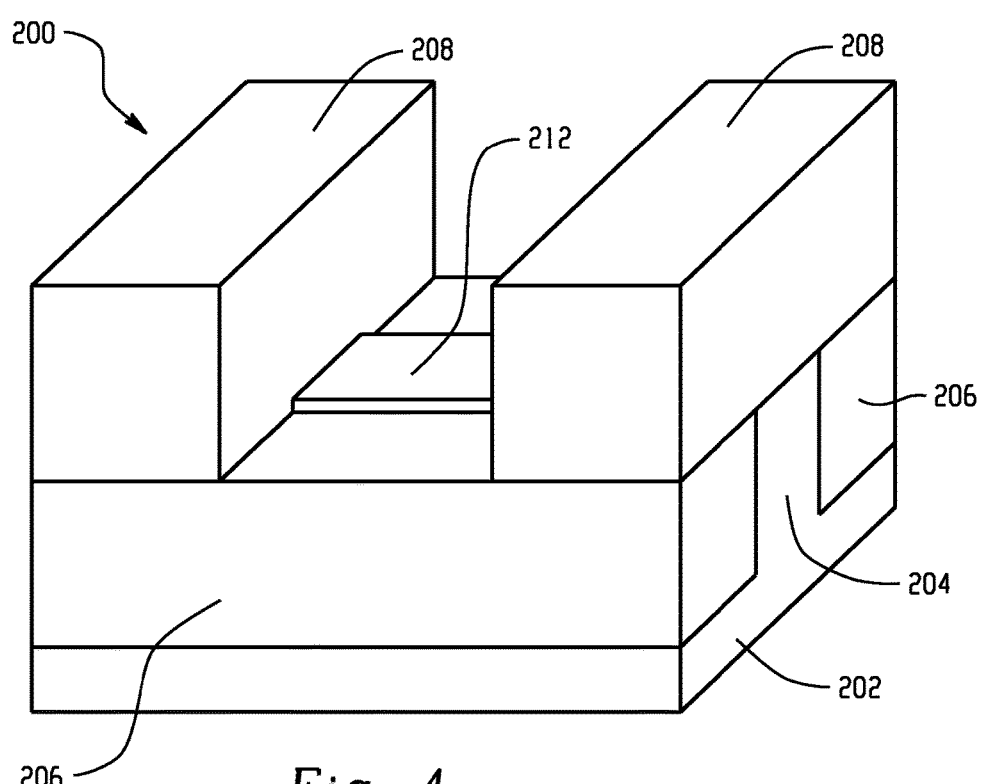

Depicted in FIG. 4, is the example semiconductor device after the dummy poly gate has been removed. Shown is dummy IL gate oxide 212 above a top face of the OD fin 204.

Figure 5:
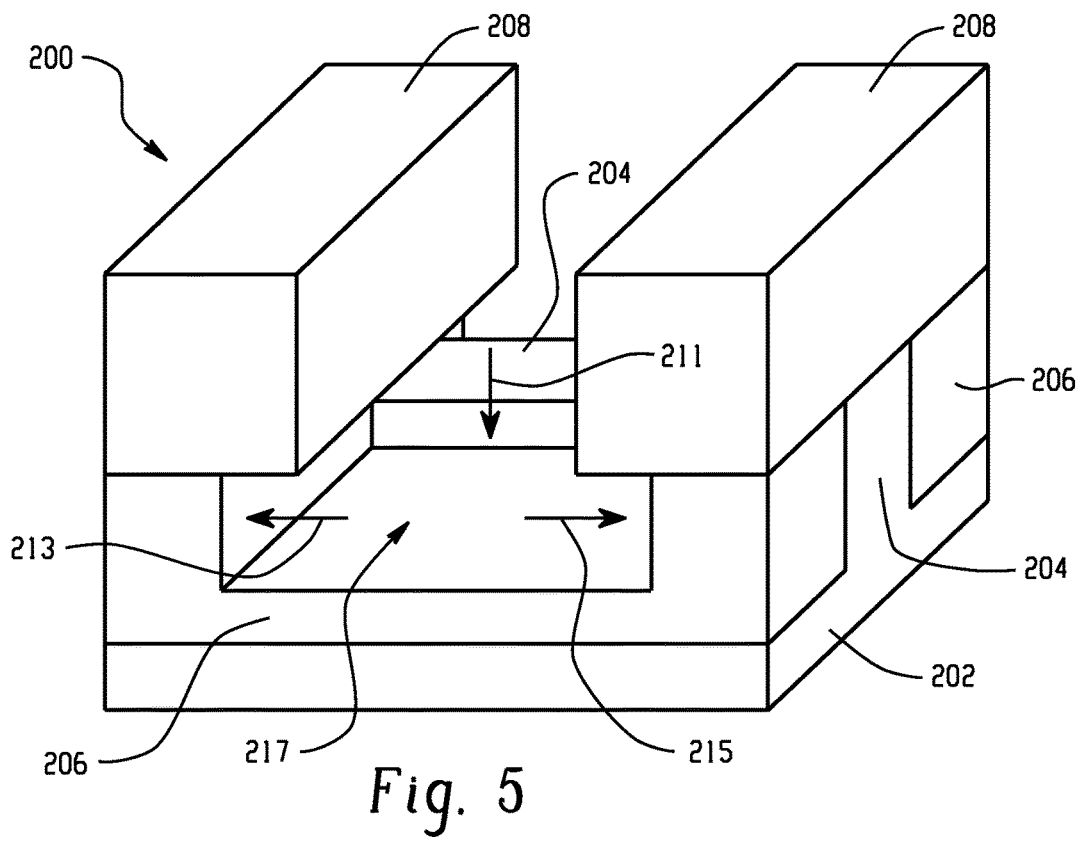

Depicted in FIG. 5, is the example semiconductor device after dry and wet etch operations have been performed. The dry etch and wet etch operations are performed to remove the dummy IL gate oxide 212, to remove STI 206 under the area vacated by the dummy poly gate (as identified by the downward point arrow 211), and to remove STI 206 under the ILD layer 208 (as identified by the lateral arrows 213, 215) and adjacent to a side face of the OD fin to form a T-shaped void 217 in the semiconductor structure. In this example, a lateral etch of 1 to 10 nm is achieved.

Figure 6:
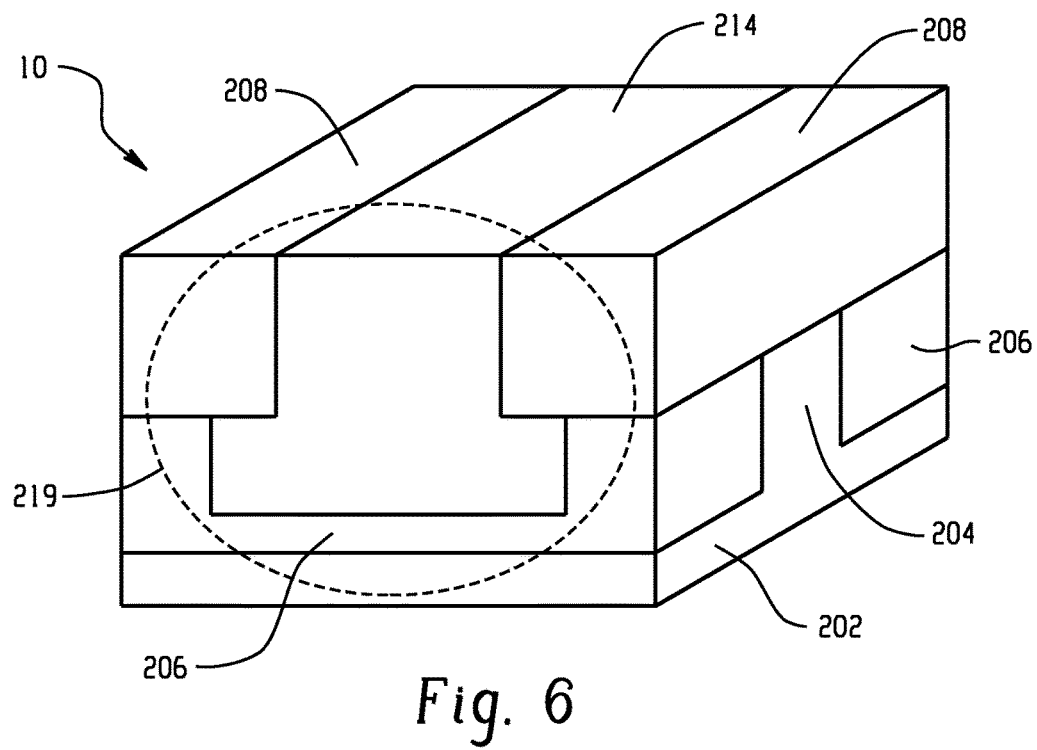

Depicted in FIG. 6, is the example semiconductor device after metal gate deposition and polishing. Shown are an OD region 202 with a raised fin 204, STI 206, an ILD layer 208, and a metal gate 214 with a T-shaped structure (as identified by the oval 219) in the metal gate line-end.

Figure 7A:
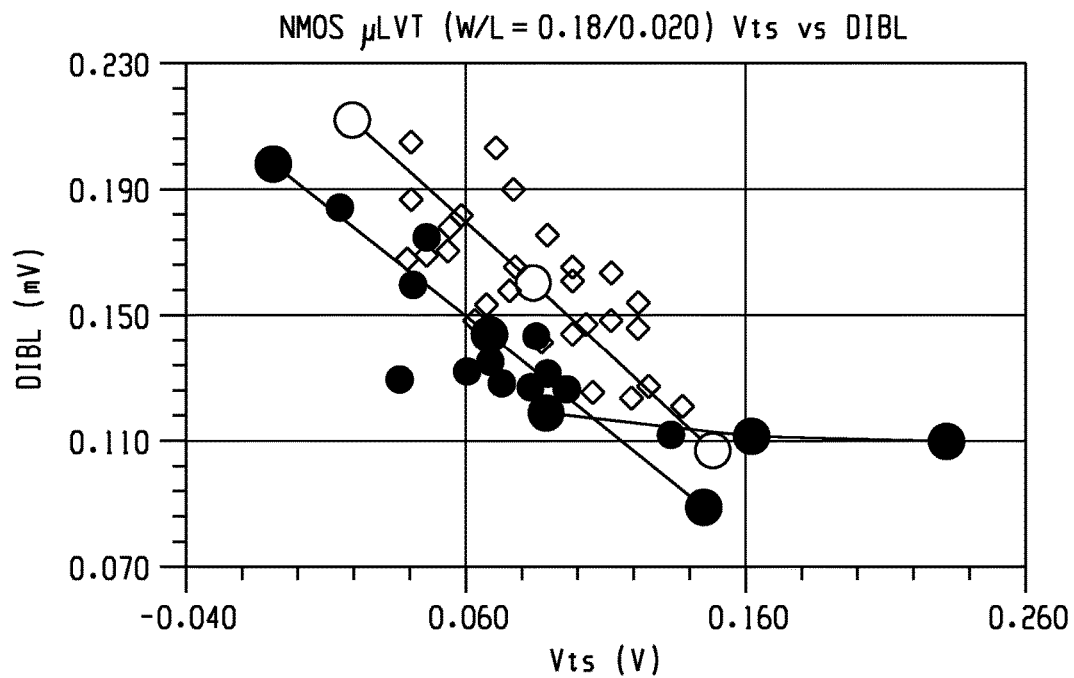
FIGS. 7A and 7B are plots illustrating the predicted drain-induced barrier lowering (DIBL) versus threshold voltage (Vts) for NMOS and PMOS transistors, in accordance with some embodiments.
Figure 7B:
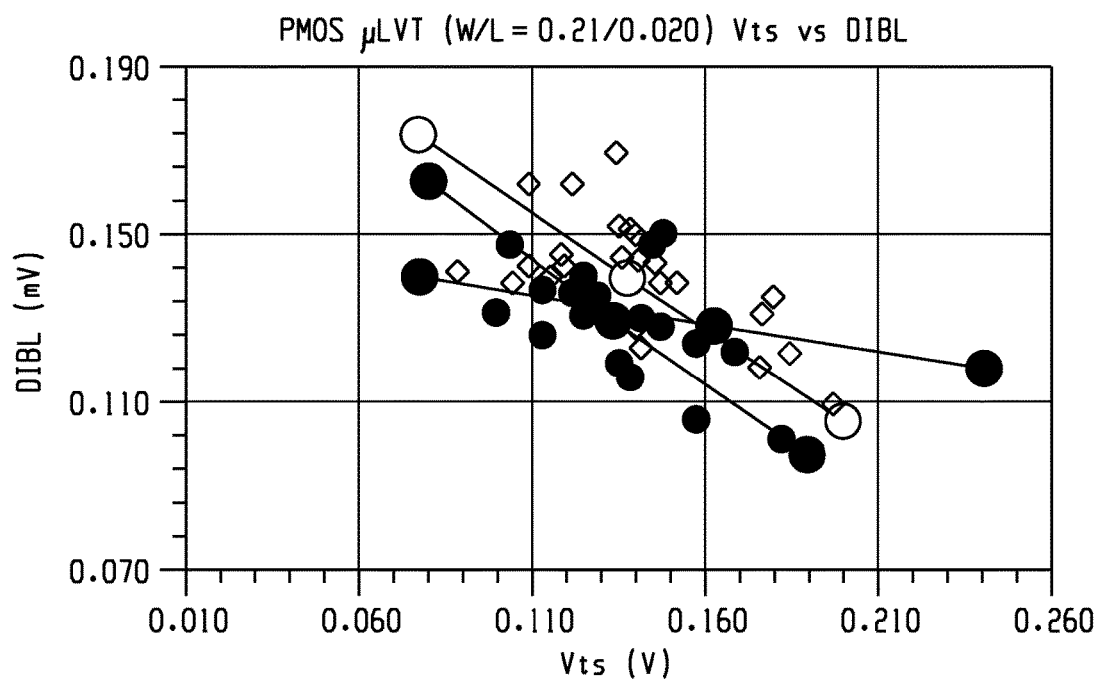

FIGS. 7A and 7B are plots illustrating the predicted drain-induced barrier lowering (DIBL) versus threshold voltage (Vts) for NMOS and PMOS transistors with the width to length (W/L) ratios specified in the charts. FIG. 7A pertains to NMOS transistors and FIG. 7B pertains to PMOS transistors. These figures show that the transistors utilizing T-shaped gate structures (indicated by the square symbols) have improved DIBL performance versus the transistors that do not utilize T-shaped gate structures (indicated by the circular symbols).

Figure 8A:
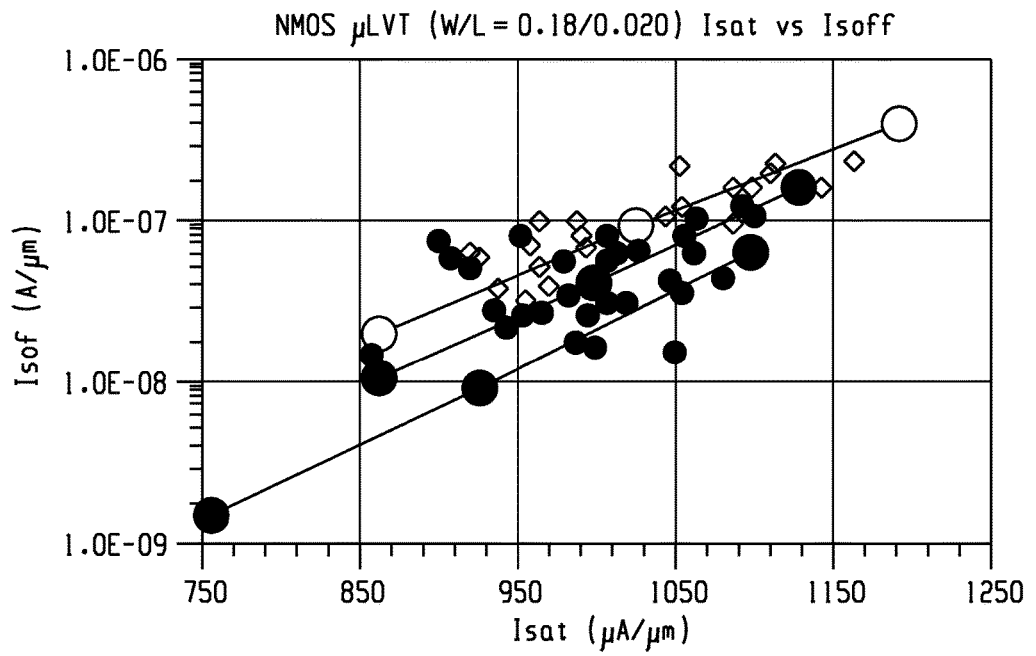
FIGS. 8A and 8B are plots illustrating the predicted off source current (Isof) versus saturation current (Isat) for NMOS and PMOS transistors, in accordance with some embodiments.
Figure 8B:
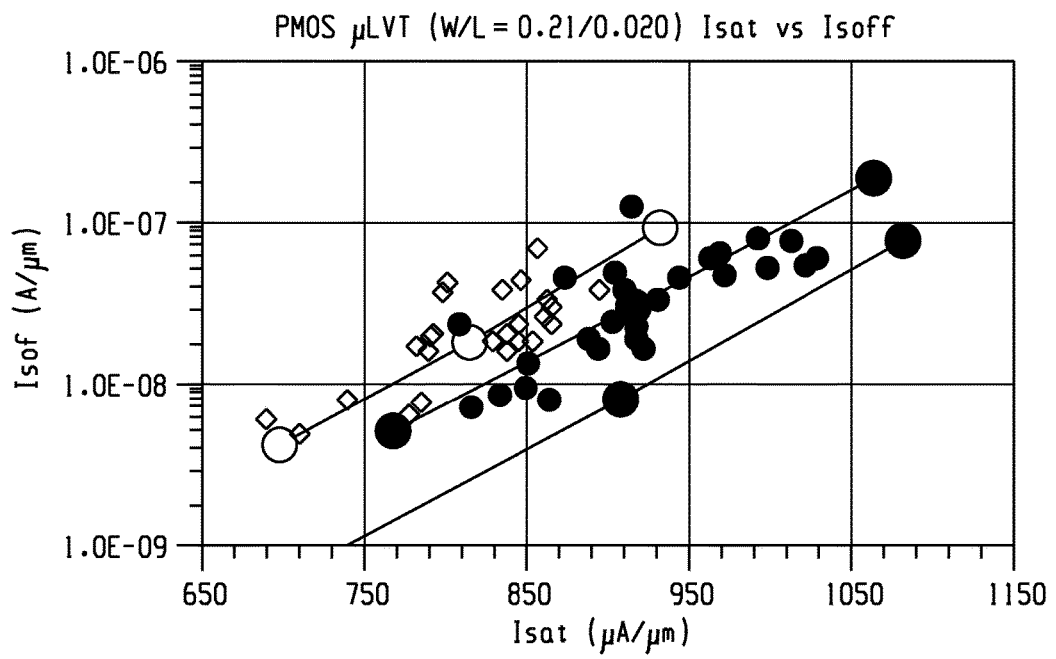

FIGS. 8A and 8B are plots illustrating the predicted off source current (Isof) versus saturation current (Isat) for NMOS and PMOS transistors with the width to length (W/L) ratios specified in the charts. FIG. 8A pertains to NMOS transistors and FIG. 8B pertains to PMOS transistors. These figures show that the transistors utilizing T-shaped gate structures (indicated by the square symbols) have improved Isof performance versus the transistors that do not utilize T-shaped gate structures (indicated by the circular symbols).

Planar transistors without a T-shaped structure in the metal gate line-end may have a less effective OD width and weaker gate control ability compared with transistors having a T-shaped structure in the metal gate line-end. By applying approaches described herein, transistors having a T-shaped structure in the metal gate line-end may be fabricated using a RPG process.

The examples disclosed herein illustrate approaches for obtaining larger effective OD width and better gate control ability and, resultantly, better device performance such as improved DIBL and Ion-Isof performance. The wet and dry etches allow for a lateral etch of 1 to 10 nm to be achieved and a T-shaped gate structure in the metal gate line-end.

In one embodiment, disclosed is a method of fabricating a metal gate structure in a semiconductor device. The method comprises removing a dummy poly gate, removing IL oxide and STI using a dry etch process and a wet lateral etch process to form a T-shape void in the semiconductor device, and depositing metal gate material in the T-shape void to form a T-shape structure in a metal gate line-end.

These aspects and other embodiments may include one or more of the following features. The dry and wet lateral etch processes result in a lateral etch of 1 to 10 nm. Removing a dummy poly gate results in IL oxide remaining above an OD section. Removing IL oxide and STI results in IL oxide removal on a top face of the OD section and STI removal adjacent to a side face of the OD section. Removing IL oxide and STI results in STI removal below a section of an ILD layer. The DIBL performance is higher than that of a semiconductor device formed without a T-shape structure in the metal gate line-end. The Isof performance is higher than that of a semiconductor device formed without a T-shape structure in the metal gate line-end.

In another embodiment, disclosed is a method of fabricating a transistor. The method comprises fabricating a semiconductor structure comprising an OD region with a raised fin, STI on sides of the raised fin, IL oxide above the fin, a dummy poly gate across the fin, and an ILD layer on sides of the dummy poly gate. The method further comprises polishing the ILD layer and dummy poly gate to reduce the height thereof, removing the dummy poly gate, removing the IL oxide and a portion of the STI to form a T-shape void in the semiconductor structure, and depositing metal gate material in the T-shape void to form a T-shape structure in a metal gate line-end.

These aspects and other embodiments may include one or more of the following features. Removing IL oxide and STI is accomplished using a dry etch process and a wet lateral etch process. Performance of the dry and wet lateral etch processes result in a lateral etch of 1 to 10 nm. Removing IL oxide and STI results in IL oxide removal on a top face of the OD section and STI removal adjacent to a side face of the OD section. Removing IL oxide and STI results in STI removal below a section of the ILD layer. The DIBL performance is higher than that of a transistor formed without a T-shape structure in the metal gate line-end. The Isof performance is higher than that of a transistor formed without a T-shape structure in the metal gate line-end.

In another embodiment, a semiconductor device fabricated from a process that included the removal of a dummy poly gate is disclosed. The semiconductor device comprises an OD fin and a metal gate fabricated above a section of the OD fin and adjacent to a side section of the OD fin. The metal gate has a T-shape structure in a metal gate line-end. The T-shape structure was formed by removing IL oxide and STI using a dry etch process and a wet lateral etch process to form a T-shape void.

These aspects and other embodiments may include one or more of the following features. The dry and wet lateral etch processes resulted in a lateral etch of 1 to 10 nm. The application of said wet lateral etch process resulted in STI removal adjacent to said side section of the OD fin. The application of said dry etch process and said wet lateral etch process resulted in STI removal below a section of an ILD layer. The DIBL performance is higher than that of a similar transistor formed without a T-shape structure in the metal gate line-end. The Isof performance is higher than that of a similar transistor formed without a T-shape structure in the metal gate line-end.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device fabricated from a process that included the removal of a dummy poly gate, the semiconductor device comprising:
    a semiconductor structure comprising (i) portions having a first thickness, and (ii) a raised fin above and in contact with the portions and having a second thickness that is greater than the first thickness, the portions and the raised fin comprising semiconductor material;
    shallow trench isolation (STI) material disposed above the portions of the semiconductor structure, wherein the STI material has a top surface that is substantially co-planar with a top surface of the raised fin;
    dielectric material, an entirety of the dielectric material being disposed above the top surface of the STI material and above the top surface of the raised fin, wherein the STI material includes a recession that exposes a sidewall of the raised fin, and the recession includes a portion under the dielectric material; and
    a metal gate including a portion above the top surface of the raised fin and a portion adjacent to the sidewall of the raised fin, the metal gate having a reversed T-shape structure in a metal gate line-end.

2. The semiconductor device of claim 1, wherein the recession extends about 1 to about 10 nm under the dielectric material.

3. The semiconductor device of claim 1, wherein the recession is formed via a lateral wet etch process.

4. The semiconductor device of claim 1, wherein a drain-induced barrier lowering (DIBL) performance of the semiconductor device is higher than that of a similar semiconductor device formed without the reversed T-shape structure in the metal gate line-end.

5. The semiconductor device of claim 1, wherein an off source current (Isof) performance of the semiconductor device is higher than that of a similar semiconductor device formed without the reversed T-shape structure in the metal gate line-end.

6. The semiconductor device of claim 1, wherein the recession exposes the sidewall of the raised fin to the metal gate.

7. A semiconductor device, comprising:
    a semiconductor structure comprising (i) portions having a first thickness, and (ii) a raised fin above and in contact with the portions and having a second thickness that is greater than the first thickness, the portions and the raised fin comprising semiconductor material;
    shallow trench isolation (STI) material disposed above the portions of the semiconductor structure, wherein the STI material has a top surface that is substantially co-planar with a top surface of the raised fin;
    dielectric material, an entirety of the dielectric material being disposed above the top surface of the STI material and above the top surface of the raised fin, wherein the STI material includes a recession that exposes sidewalls of the raised fin, and the recession includes a portion under the dielectric material; and
    a gate structure horizontally saddling over the raised fin, the gate structure including a central portion providing planar coverage over a portion of the top surface of the raised fin and a pair of leg portions providing lateral coverage over the sidewalls of the raised fin, wherein a length of coverage by the gate structure over the top surface is less than a length of coverage by the gate structure over the sidewalls, the coverage lengths extending along a channel direction defined by the raised fin.

8. The device of claim 7, wherein the raised fin comprises an elongated planar profile.

9. The device of claim 8, wherein the sidewalls comprise portions of the elongated profile.

10. The device of claim 7, wherein portions of the exposed sidewalls of the raised fin are covered by the dielectric material.

11. The device of claim 10, wherein the leg portion of the gate structure extends underneath the dielectric material.

12. The device of claim 11, wherein the leg portion extends underneath the dielectric material along a channel direction defined by the raised fin.

13. The device of claim 12, wherein the leg portion substantially defines a reverse T-shape profile along the channel direction.

14. The device of claim 7, wherein the gate structure comprises a gate dielectric layer disposed over the top surface of the raised fin.

15. The device of claim 14, wherein the gate dielectric layer comprises a hi-K dielectric material, and the gate structure further comprises a metal gate material disposed over the gate dielectric layer.

16. The semiconductor device of claim 7, wherein the recession exposes the sidewall of the raised fin to the gate structure.

17. A semiconductor device, comprising:
    a semiconductor structure comprising (i) portions having a first thickness, and (ii) a raised fin above and in contact with the portions and having a second thickness that is greater than the first thickness, the portions and the raised fin comprising semiconductor material;
    shallow trench isolation (STI) material disposed above the portions of the semiconductor structure, wherein the STI material has a top surface that is substantially co-planar with a top surface of the raised fin;
    dielectric material, an entirety of the dielectric material being disposed above the top surface of the STI material and above the top surface of the raised fin, wherein the STI material includes a recession that exposes a sidewall of the raised fin, and the recession includes a portion under the dielectric material; and
    a gate structure horizontally saddling over the raised fin and covering at least portions of the top surface and the sidewall of the raised fin, wherein a coverage length of the gate structure over the top surface of the raised fin is less than a coverage length of the gate structure over the sidewall of the raised fin, the coverage lengths extending along a channel direction defined by the raised fin.

18. The device of claim 17, wherein a portion of the gate structure extends underneath the dielectric material.

19. The device of claim 17, wherein the gate structure defines a substantially reversed T-shape profile along the channel direction.

20. The semiconductor device of claim 17, wherein the recession exposes the sidewall of the raised fin to the gate structure.

* * * * *